(12) United States Patent
Lin

(10) Patent No.: US 7,088,605 B2
(45) Date of Patent: Aug. 8, 2006

(54) FERAM MEMORY DESIGN USING ROM ARRAY ARCHITECTURE

(75) Inventor: Chin-Hsi (Dennis) Lin, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/884,290

(22) Filed: Jul. 2, 2004

(65) Prior Publication Data
US 2006/0002169 A1   Jan. 5, 2006

(51) Int. Cl.
G11C 11/22 (2006.01)
G11C 11/24 (2006.01)
(52) U.S. Cl. .................................. 365/145; 365/149
(58) Field of Classification Search ................ 365/145, 365/149
See application file for complete search history.

(56) References Cited

U.S. PATENT DOCUMENTS

| | | | | |
|---|---|---|---|---|
| 4,873,664 | A * | 10/1989 | Eaton, Jr. | 365/149 |
| 5,406,510 | A * | 4/1995 | Mihara et al. | 365/149 |
| 6,111,777 | A * | 8/2000 | Ogiwara et al. | 365/145 |
| 6,157,979 | A * | 12/2000 | Barnett | 365/145 |
| 6,198,653 | B1 * | 3/2001 | Tanaka | 365/145 |
| 6,233,170 | B1 * | 5/2001 | Yamada | 365/145 |
| 6,288,930 | B1 | 9/2001 | Takeshima et al. | |
| 6,292,385 | B1 | 9/2001 | Kim | |
| 6,327,682 | B1 | 12/2001 | Chien et al. | |
| 6,333,202 | B1 | 12/2001 | Adkisson et al. | |
| 6,519,203 | B1 * | 2/2003 | Ashikaga | 365/145 |
| 6,657,883 | B1 * | 12/2003 | Takashima | 365/145 |
| 6,873,536 | B1 * | 3/2005 | Komatsuzaki | 365/145 |
| 6,876,590 | B1 * | 4/2005 | Joachim et al. | 365/145 |

OTHER PUBLICATIONS

L.G. Heller et al., "High Sensitivity Charge-Transfer Sense Amplifier," *IEEE J. Solid-State Circuits*, vol. Sc-11, No. 5, Oct. 1976, pp. 596-601.
S. Kawashima et al., "A Bit-Line GND Sense Technique for Low-Voltage Operation FeRAM," *2001 Symposium on VLSI Circuits Digest of Technical Papers*, Session 12-3A (2001).

* cited by examiner

*Primary Examiner*—Trong Phan
(74) *Attorney, Agent, or Firm*—Martine Penilla & Gencarella, LLP

(57) ABSTRACT

A FeRAM array configured in a ROM format is provided. The FeRAM array includes a memory array that has a plurality of segmented BL/PL arrays, and each segmented BL/PL array defines an I/O. A plurality of charge transfer sense amplifiers is further provided. Each charge transfer sense amplifier is associated with each I/O, and each charge transfer sense amplifier includes a cross coupled latch that is connected between a memory cell access portion and a reference voltage generation portion of the charge transfer sense amplifier. The reference voltage generation portion further includes a reference bitline (Crb) coupled to a reference voltage (Vr), and the reference bitline (Crb) is coupled to a pair of dummy capacitance cells. Each of the dummy capacitance cells is preset before reading at an opposite relative polarity. A pair of parallel capacitances is coupled to the reference voltage (Vr), and the pair of dummy capacitance cells and the pair of parallel capacitances operate to generate a mid-voltage at the reference voltage (Vr) during a particular state of operation.

23 Claims, 5 Drawing Sheets

FERAM MEMORY DESIGN USING ROM ARRAY ARCHITECTURE

BACKGROUND OF THE INVENTION

1. Field of the Invention

The present invention relates generally to memory circuitry and, more particularly, to high density and low power FeRAM devices integrated based on a read only memory (ROM) architecture.

2. Description of the Related Art

Similar to dynamic random access memory (DRAM) cells, a ferroelectric random access memory (FeRAM) cell structure includes a storage capacitance (C) to retain data and a transistor (T) to access data. Unlike DRAMs, which use paraelectrics such as silicon oxidized films or silicon nitride film for the storage capacitance, FeRAM structures use ferroelectrics. Cell information is detected by reading the change in current that results from the change in polarization charges when a voltage is applied to a cell.

As shown in prior art FIG. 1, the storage cell 10 is activated through the word-line (WL) 12, and written or read through the bit-line (BL) 14 and plate-line (PL) 16. As illustrated, the storage cell 10 includes a storage capacitor that can store a ferroelectric capacitance ($C_{FE}$), to define a voltage differential "$V_c$." In writing a binary digit 0 to the cell, a positive voltage (normally the full power supply, VDD) is applied to BL 14 while PL 16 is grounded and WL 12 is asserted. In writing a binary digit 1, a positive voltage is applied to PL 16 while BL 14 is grounded and WL 12 is asserted.

Reading stored data includes a sequence of: (1) precharging BL 14; (b) asserting WL 12; (c) pulsing PL 16; and (d) sensing the voltage developed on BL by a sense amplifier (not shown). Since the reading procedure is destructive, the sensed data must be written back to the memory cell 10. This will be automatically done after the data is latched in the sense amplifier by restoring PL 16 back to ground level.

A DRAM cell, which is volatile memory, is designed to keep information in only a power-on state even though it has a high operating speed. A DRAM therefore has a drawback in that the consumption of power is excessive because refreshing of data is carried out at certain time intervals to prevent data from being lost due to leakage current from a charge transfer transistor coupled to a capacitor. FeRAM cells have an advantage in that they have an operating speed similar to that of DRAMs while exhibiting reduced power consumption. That is, a FeRAM is a non-volatile memory capable of keeping data even in a power-off state, like EEPROMs and flash memories.

However, in current designs, FeRAMs are based on a standard RAM array architecture, which necessarily introduces challenges. For instance, when plate line (PL) and wordline (WL) are parallel, the design will activate all cells being controlled by the same wordline, and the respective sense amplifiers (SAs) are turned on necessarily so that the stored data of the cells will not be lost. In cases where the PL/BL are parallel and in cases of shifted bias PL, there will be only one SA ON for every I/O, however, there are respective SAs connecting to the bitlines (BL). Accordingly, current prior art techniques, such as those mentioned above, which include: (a) PL/WL parallel; (b) PL/BL parallel; and (c) shifted bias PL, all have drawbacks. Case (a) has large power consumption (i.e., high active current drain) requirements due to the need to turn all sense amplifiers along a wordline ON. And, cases (b) and (c) each require many SAs to be used, which takes up valuable chip area, although only one SA of one I/O is ON for accessing at a particular time.

Additional details regarding FeRAMs are set forth in the following publications: (1) S. Kawashima, T. Endo, A. Yamamoto, K. Nakabayashi, M. Nakazawa, K. Morita, and M.Aoki, "A Bit-Line GND Sense Technique for Low-Voltage Operation FeRAM," *Symp. VLSI Circuits* 2001 *Tech. Dig.*, pp. 127–128 (2001); and (2) L. Heller, D. Spaminato, Y. Lao, "High Sensitivity Charge-Transfer Sense Amplifier," *IEEE J. Solid State Circuits*, vol. SC-11, pp. 596–601, October 1976. The disclosures of these publications are incorporated herein by reference.

In view of the foregoing, there is a need for a storage memory array architecture that provides high speed characteristics, provides low power consuming characteristics, and also provides for a dense layout for reducing chip area usage.

SUMMARY OF THE INVENTION

Broadly speaking, the present invention fills this need by providing a high density and low power FeRAM array design and modified charge transfer sense amplifier (SA). In a preferred embodiment, the FeRAM array design is based on a read only memory (ROM) architecture to reduce operating current because only selected sense amplifiers of selected I/Os are activated in page-mode SPEC. It should be appreciated that the present invention can be implemented in numerous ways, including as a process, a system, or a device. Several inventive embodiments of the present invention are described below.

In one embodiment, a FeRAM device is disclosed. The FeRAM device includes a memory array that has a plurality of segmented BL/PL arrays, and each segmented BL/PL array defines an I/O. A plurality of charge transfer sense amplifiers is further provided. Each charge transfer sense amplifier is associated with each I/O, and each charge transfer sense amplifier includes a cross coupled latch that is connected between a memory cell access portion and a reference voltage generation portion of the charge transfer sense amplifier.

In another embodiment, a FeRAM array configured in a ROM format is disclosed. The FeRAM array includes a memory array that has a plurality of segmented BL/PL arrays, and each segmented BL/PL array defines an I/O. A plurality of charge transfer sense amplifiers is further provided. Each charge transfer sense amplifier is associated with each I/O, and each charge transfer sense amplifier includes a cross coupled latch that is connected between a memory cell access portion and a reference voltage generation portion of the charge transfer sense amplifier. The reference voltage generation portion further includes a reference bitline (Crb) coupled to a reference voltage (Vr), and the reference bitline (Crb) is coupled to a pair of dummy capacitance cells. Each of the dummy capacitance cells is preset before reading at an opposite relative polarity. A pair of parallel capacitances is coupled to the reference voltage (Vr), and the pair of dummy capacitance cells and the pair of parallel capacitances operate to generate a mid-voltage at the reference voltage (Vr) during a particular state of operation.

In yet another embodiment, a charge transfer sense amplifier for use in accessing data of a FeRAM array is disclosed. In this preferred embodiment, as is the case in ROM architectures, each charge transfer sense amplifier is associated with an input/output (I/O) of the FeRAM array. The charge transfer sense amplifier includes a cross coupled latch that is connected between a memory cell access portion and a reference voltage generation portion. The reference voltage generation portion includes a reference bitline (Crb) that is coupled to a reference voltage (Vr). The reference bitline (Crb) is coupled to a pair of dummy capacitance cells, and each of the dummy capacitance cells is preset before reading at an opposite relative polarity. A pair of parallel capacitances is further provided and is coupled to the reference voltage (Vr). The pair of dummy capacitance cells and the pair of parallel capacitances operate to generate a mid-voltage at the reference voltage (Vr) during a stage of operation.

The advantages of the present invention are numerous. Most notably, however, is that the disclosed FeRAM array is based on a ROM array. The charge transfer sense amplifier is also modified so that it is no longer dependent on Cb/Cf. Specifically, conventional DRAM or FeRAM use a latch SA that is directly coupled to the bitline. When the wordline is selected, stored charge for DRAM or polarized charge for FeRAM will share with the capacitor of the bit line, so the Cb (bit line capacitance) will affect the read voltage. The charge transfer scheme of the present invention avoids this drawback of conventional designs.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for a high density and low power FeRAM array, which is based on a read only memory (ROM) architecture. Specific details of several embodiments of the present invention are described below. It will be obvious to one skilled in the art, however, that the present invention may be practiced without some or all of these specific details. In other instances, well known process operations have not been described in detail to avoid obscuring the present invention unnecessarily.

The embodiments of the present invention define a memory structure for FeRAMs that, instead of basing the architecture on random access memory (RAM) design, use a read only memory (ROM) design. A modified charge transfer sense amplifier (SA) scheme is also presented. The combined ROM based design and modified charge-transfer SA provides for a high density and low power FeRAM design.

Figure 1:
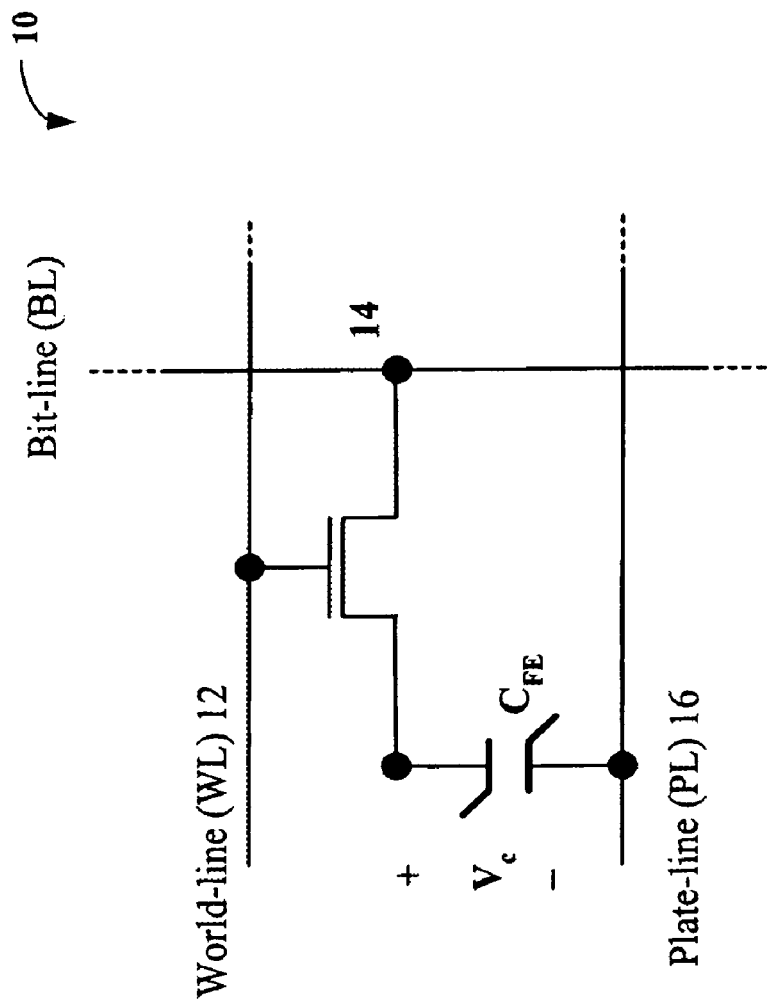
FIG. 1 shows a conventional FeRAM cell.
Figure 2:
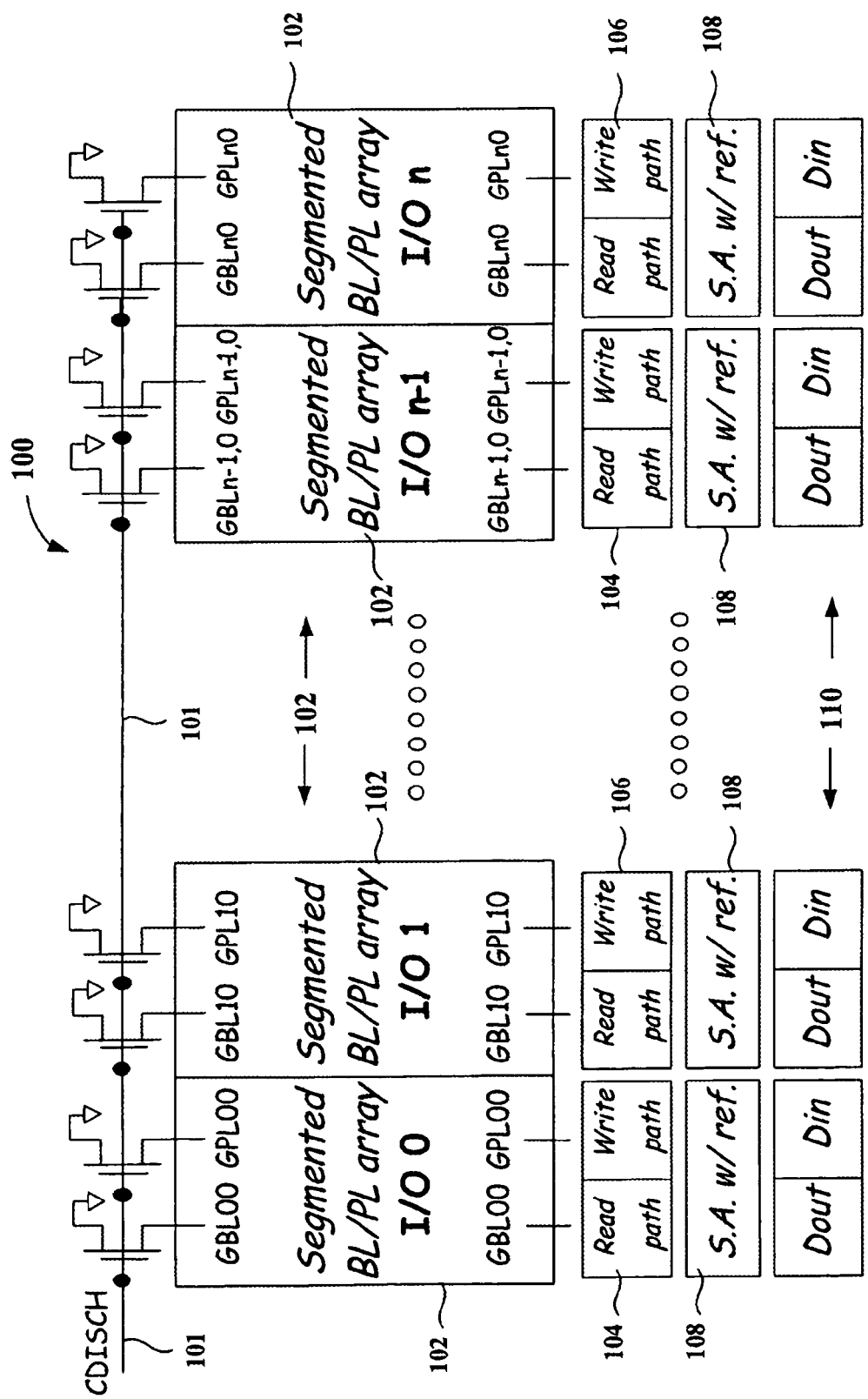
FIG. 2 illustrates a memory array architecture that implements segmented bitline (BL)/Plate Line (PL) arrays in a ROM orientation in accordance with one embodiment of the present invention.

FIG. 2 illustrates a memory array architecture 100 that implements segmented bitline (BL)/Plate Line (PL) arrays in a ROM orientation, in accordance with one embodiment of the present invention. As shown, the memory array architecture 100 has a control line CDISCH (signal) 101 for activating the array during precharge, charge transfer, sensing, and write back. Each of the segmented BL/PL arrays 102 is associated with a particular input/output (I/O) of the memory device. Example embodiments can, for example, implement x8, x16, x32, . . . etc. I/O connections. In this embodiment, only the particular I/O sense amplifier 108 that is selected (i.e., in page-mode SPEC) needs to be on. This advantageously reduces the current drain that would be imposed by a prior art FeRAM design in which all sense amplifiers would be triggered.

Figure 4:
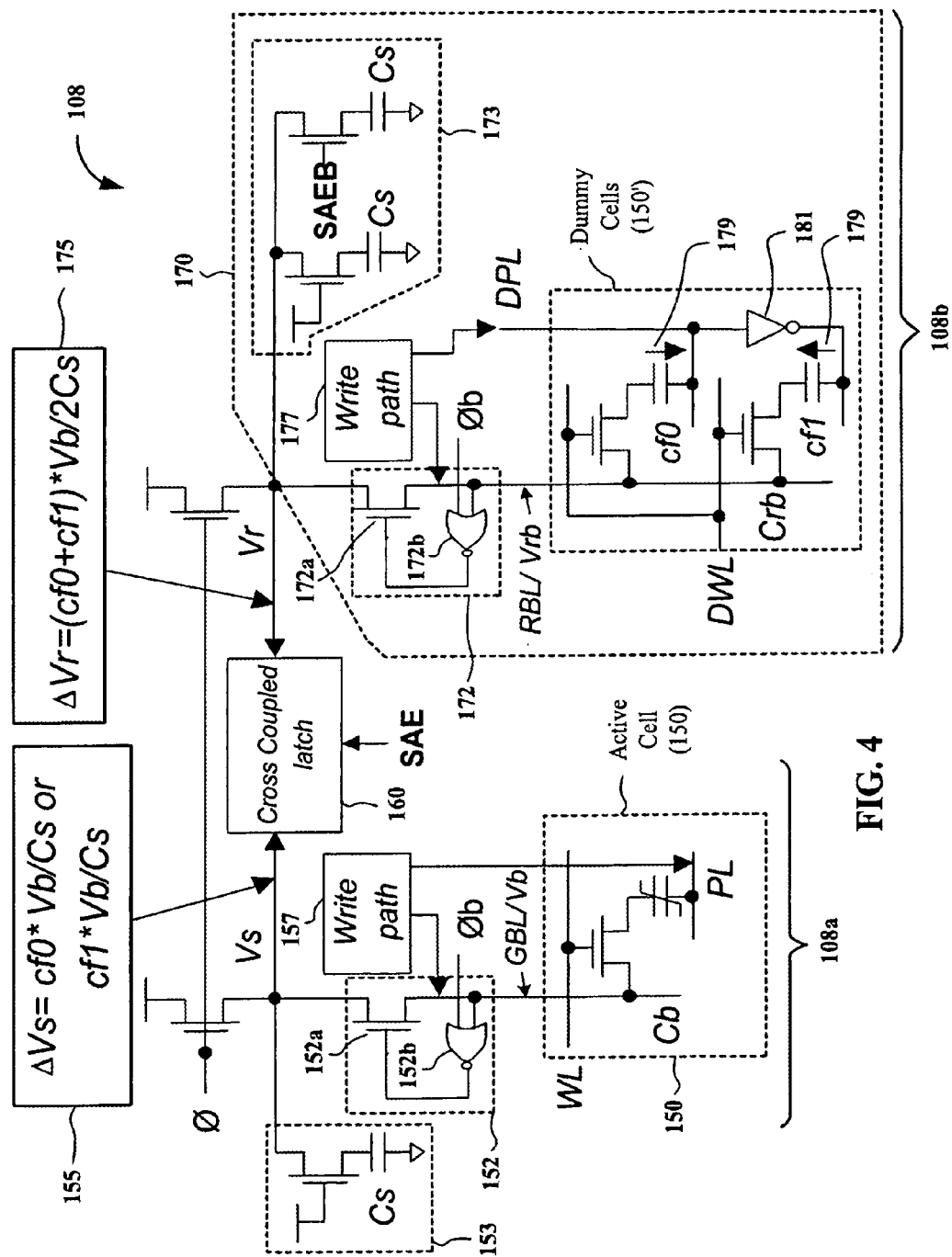
FIG. 4 illustrates a modified charge transfer sense amplifier (SA) in accordance with one embodiment of the present invention.

Continuing with reference to FIG. 2, each of the segmented BL/PL arrays 102 includes global bitlines (GBL) and global plate lines (GPL). The global bits lines are coupled to the read path 104 and the global plate lines are coupled to the write path 106 for each I/O. The sense amplifiers 108 are provided with an internal reference voltage (Vr), which is generated as shown in FIG. 4 below. The data in (Din) and data out (Dout) 110 are, for completeness, also shown coupled to each I/O of the array.

Figure 3:
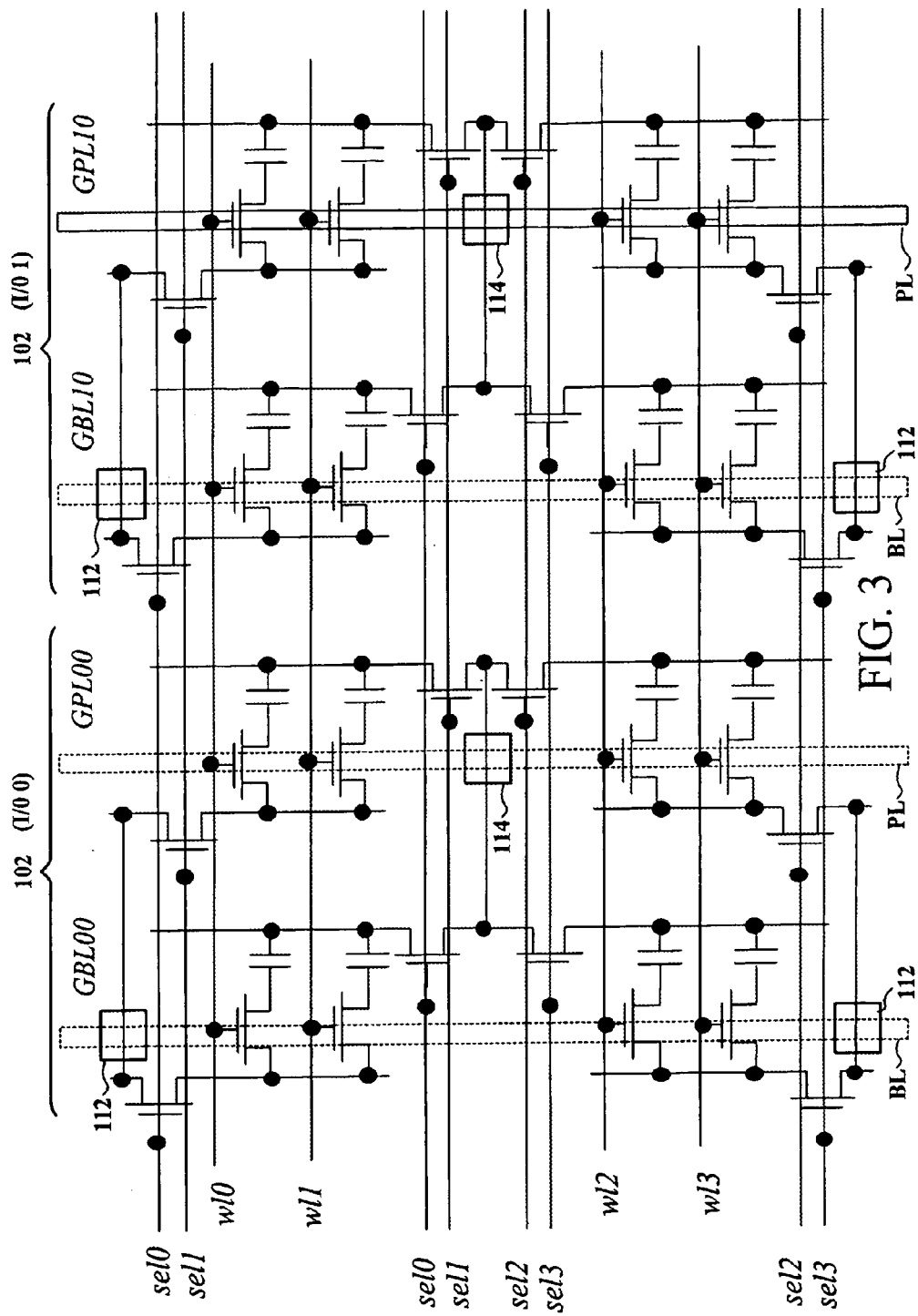
FIG. 3 illustrates a detailed diagram of the segmented BL/PL array of FIG. 2 in accordance with one embodiment of the present invention.

FIG. 3 illustrates a detailed diagram of the segmented BL/PL array 102 of FIG. 2, in accordance with one embodiment of the present invention. As shown, the segmented BL/PL array 102 is arranged in a ROM format, and select lines shown as sel0, sel1, sel2, sel3, etc., determine access to particular cells 112 and 114 coupled between bitlines and plate lines, in conjunction with proper selection of particular wordlines, shown as wl0, wl1, wl2, wl3, etc. It is important to note that the segmented BL/PL array 102 of FIG. 3 is only an example, and modifications can be made while still meeting the ROM type architecture design and functionality.

FIG. 4 illustrates a modified charge transfer sense amplifier (SA), in accordance with one embodiment of the present invention. Schematically, the modified charge transfer SA 108 is divided into two portions, one being a memory cell access portion 108a and the other being a reference voltage generation portion 108b. As shown, an exemplary storage cell 150 (illustrated as Active Cell 150 in FIG. 4) is coupled to bitline Cb and wordline WL. The bitline Cb has a cascade device 152 coupled to Vs. The cascade device 152 includes an NMOS transistor 152a and a NOR gate 152b. An NMOS transistor and capacitor Cs, shown generally by reference 153, are coupled to node Vs. Delta Vs, as shown in box 155, results in Cf0*Vb/Cs or Cf1*Vb/Cs.

A pair of dummy cells 150' is shown coupled to bitline Crb and dummy wordline DWL. An inverter 181 is shown connected along a dummy plate line (DPL) between each of the dummy cells 150'. Bitline Crb has a cascade device 172 coupled to reference voltage (Vr). The cascade device 172 includes an NMOS transistor 172a and a NOR gate 172b. As shown, GBL/Vb and RBL/Vrb are input to the NOR gates 152b and 172b. $\phi_b$ is a binary signal (0 or 1). which is fed to an input of the NOR gates 152b and 172b, such that the same binary value is fed to both inputs, as illustrated in FIG. 4. Further shown, NMOS transistors and capacitors Cs, shown generally by reference 173, are coupled in parallel to the Vr node. The NMOS transistors of 173 have their gates coupled to rail voltage and sense amp enable-B (SAEB), respectively. In this exemplary embodiment, circuit 170 generates the reference voltage Vr. Delta Vr, as shown in box 175, produces (Cf0+Cf1)*Vb/2Cs. Therefore, the resulting Delta Vs is coupled to Delta Vr with cross coupled latch 160, which receives a sense amp enable (SAE). As noted, circuit 170 generates Vr, which is the reference voltage between Vs(1), while the polarized state of read memory is DOWN, and Vs(0), while the polarized state of read memory is UP. Accordingly, the two reference cells Cf0 and Cf1 are used to generate a mid-voltage level, i.e., Vs(0)<Vr<Vs(1). DPL is for switching the states while write back occurs.

In general, there are two phases of operation. One phase is the precharge period, which, with signal φ being on, defines Vb/Vrb~Vc (i.e., a coercive voltage). The other phase is the charge transfer period. When the wordline is on, the selected ferroelectric capacitors will be biased as Vf~Vc, and this will exhibit Cf1 and Cf0, the capacitance, respectively, based on the stored polarization state. The capacitance will take the charges from the node Vs (Vr).

In operation, the cascade device 152 (i.e., NMOS transistor+NOR gate) replaces a standard Vr, i.e., a fixed voltage, to speed up response time. In the preferred embodiment, the Reference Bit Line (RBL) is used to create the reference voltage that controls two dummy cells Cf0 and Cf1, whose wordline is DWL. These two dummy cells will be set at different polarized states to get the proper capacitances. When sensing the memory cell 152, the two dummy cells will be accessed simultaneously, the capacitance of accessed cell will reflect on the node Vs, and the dummy cells will reflect on the node Vr. After Vs and Vr are precharged, the reflected (transferred) charge will make Vs and Vr pull down delta Vs and delta Vr, respectively. To set Vr between Vs(0) and Vs(1), which represents the Vs voltage of read data "1" and "0", 2 Cs of 173 are set to get this result.

The Write Path 157 is the path of the external data write to respective memory cells. External data will be encoded as COMS levels by the DIN_BUF (data-in buffer) and through the path to couple the voltage bias to the PL node and bitline Cb of the memory cell (i.e., the ferroelectric capacitors that make up FeRAM cells). As is well known, FeRAM reading is destructive, so write-back is necessary after reading. The write-paths 157 will be controlled by the cross coupled latch 160, and based on the read data, the write-paths 157 will bias the memory cells. The write path 177 operates for reference voltage generation circuit 170. Write path 177 generates the reference voltage Vr and also destroys the polarized states of Cf0 and Cf1. The two reference cells Cf0 and Cf1 will thus need be written back with a different polarized state (i.e., as shown by arrows 179) to be ready for the next reading. In this embodiment, the reference cells Cf0 and Cf1 will be polarized to different states to provide improved fatigue immunity, as the two reference cells Cf0 and Cf1 will be accessed during every memory cell reading operation.

Figure 5:
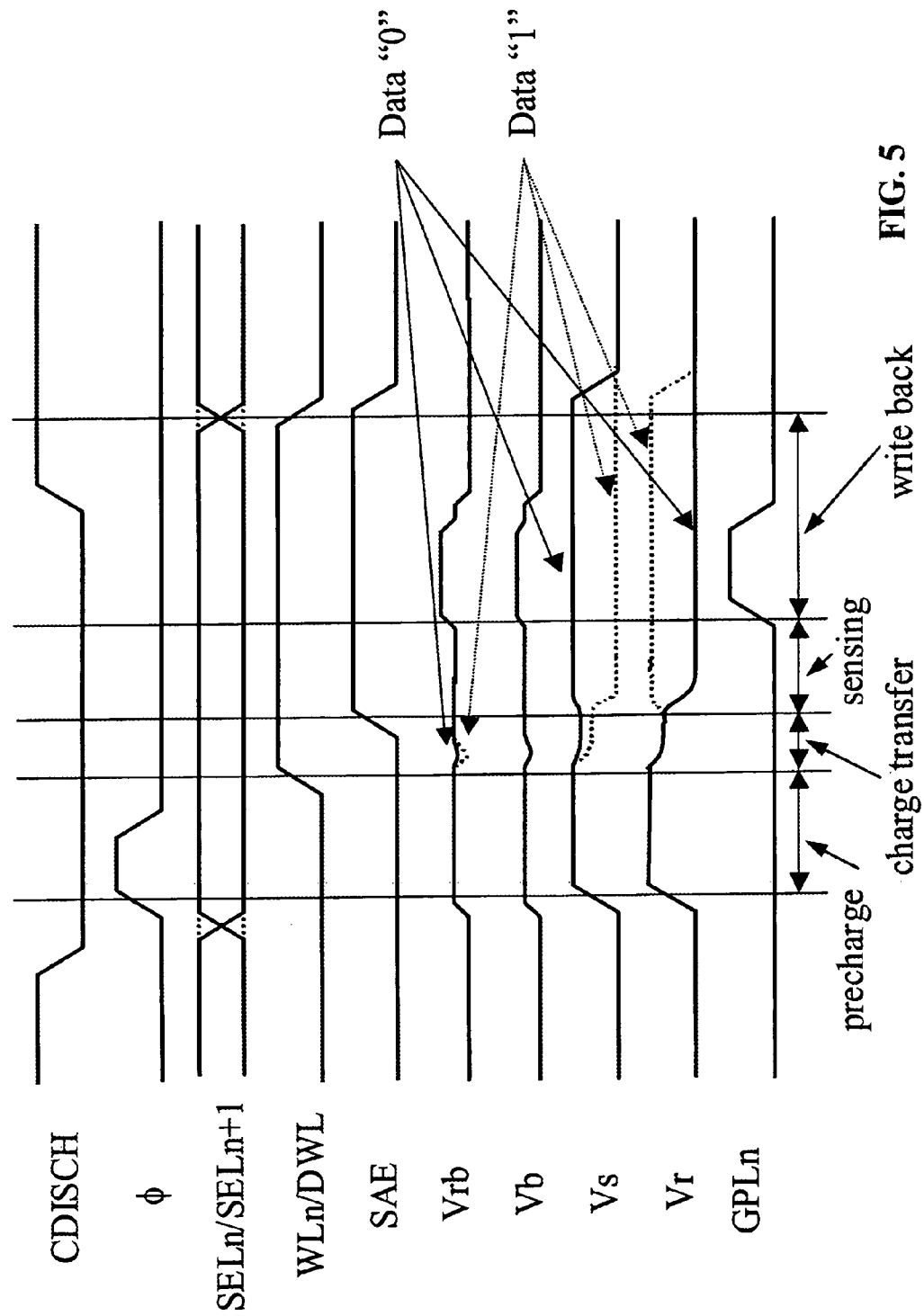
FIG. 5 illustrates an exemplary timing diagram of the circuitry of the present invention.

FIG. 5 illustrates an exemplary timing diagram of the circuitry of the present invention. A plot is provided for each of signals CDISCH, φ, SELn/SELn+1, WLn/DWL, SAE, Vrb, Vb, Vs, Vr, and GPLn. The plot is provided for each operating time period, including the precharge period, the charge transfer period, the sensing period, and the write back period.

Specifically, when address toggling is sensed, CDISCH will be coupled to a low level and will discharge the bit line, then φ is coupled to high to precharge Vs, Vr and Vb, Vbr. After precharge ends, wordline will be on then the polarized charge will affect the Vb and Vbr level in a short period of time. Finally Vb and Vbr will be charged up to the original precharge level by Vs and Vr, respectively. The final Vs and Vr levels are related to the polarized charges. The developed Vs and Vr level will be coupled to the CMOS level based on their respective high/low while the SAE signal goes high to enable the latch sense amplifier, as shown in the sensing period of FIG. 5. As mentioned above, write-back is a requirement for FeRAM operation, so GPLn is coupled as period-high and Vb and Vrb will be coupled to CMOS high/low based on the final developed Vs and Vrb through the write-path.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A FeRAM device, comprising:
    a memory array including a plurality of segmented BL/PL arrays, each segmented BL/PL array defining an I/O; and
    a plurality of charge transfer sense amplifiers, each charge transfer sense amplifier being associated with each I/O, each charge transfer sense amplifier further including a cross coupled latch that is connected between a memory cell access portion and a reference voltage generation portion of the charge transfer sense amplifier,
    wherein the reference voltage generation portion includes a reference bitline (Crb) that is coupled to a pair of dummy capacitance cells for generating a mid-voltage, each of the dummy capacitance cells is configured to be charged to an opposite polarized state, and the reference bitline (Crb) is further coupled to two parallel capacitors (2Cs), the pair of dummy capacitance cells, and the two parallel capacitors (2Cs) enabling the generation of a mid-voltage at a reference voltage (Vr).

2. The FeRAM device as recited in claim 1, wherein the memory array is in a read only memory (ROM) array format.

3. The FeRAM device as recited in claim 1, wherein the mid-voltage is defined as Vs(0)<Vr<Vs(1), where Vs(0) defines storage of "0" and Vs(1) defines storage of "1."

4. The FeRAM device as recited in claim 1, wherein a bitline (Cb) of the memory cell access portion includes a cascade device, the cascade device including an NMOS transistor and a NOR gate.

5. The FeRAM device as recited in claim 1, wherein a reference bitline (Crb) of the reference voltage generation portion includes a cascade device, the cascade device including transistor an NMOS and a NOR gate.

6. The FeRAM device as recited in claim 1, wherein the memory cell access portion includes a write path, the write path coupling to a bitline Cb and a plate line PL.

7. The FeRAM device as recited in claim 1, wherein the reference voltage generation portion includes a write path, the write path coupling to a reference bitline Crb and a dummy plate line DPL.

8. A FeRAM array configured in a ROM format, comprising:
    a memory array including a plurality of segmented BL/PL arrays, each segmented BL/PL array defining an I/O; and
    a plurality of charge transfer sense amplifiers, each charge transfer sense amplifier being associated with each I/O, each charge transfer sense amplifier further including a cross coupled latch that is connected between a memory cell access portion and a reference voltage generation portion of the charge transfer sense amplifier, the reference voltage generation portion further includes, a reference bitline (Crb) coupled to a reference voltage (Vr), the reference bitline (Crb) being coupled to a pair of dummy capacitance cells, each of the dummy capacitance cells being preset before reading at an opposite relative polarity, and a pair of parallel capacitances coupled to the reference voltage (Vr), wherein the pair of dummy capacitance cells and the pair of parallel capacitances operate to generate a mid-voltage at the reference voltage (Vr) at a state of operation.

9. A FeRAM array configured in a ROM format as recited in claim 8, further comprising a dummy plate line (DPL) that couples to each of the pair of dummy capacitance cells.

10. A FeRAM array configured in a ROM format as recited in claim 9, wherein an inverter is coupled between each of the pair of dummy capacitance cells along the reference bitline (Crb).

11. A FeRAM array configured in a ROM format as recited in claim 8, wherein a cascade device including an NMOS transistor and a NOR gate is coupled along the reference bitline (Crb).

12. A FeRAM array configured in a ROM format as recited in claim 8, wherein the mid-voltage is defined as Vs(0)<Vr<Vs(1), where Vs(0) defines storage of "0" and Vs(1) defines storage of "1."

13. A FeRAM array configured in a ROM format as recited in claim 8, wherein a bitline (Cb) of the memory cell access portion includes a cascade device, the cascade device including an NMOS transistor and a NOR gate.

14. A FeRAM array configured in a ROM format as recited in claim 8, wherein the memory cell access portion includes a write path, the write path coupling to a bitline Cb and a plate line PL.

15. A FeRAM array configured in a ROM format as recited in claim 8, wherein the reference voltage generation portion includes a write path, the write path coupling to a reference bitline Crb and a dummy plate line DPL.

16. A charge transfer sense amplifier for use in accessing data of a FeRAM array, wherein one of said charge transfer sense amplifiers is associated with an input/output (I/O) of the FeRAM array, the charge transfer sense amplifier comprising:

a cross coupled latch that is connected between a memory cell access portion and a reference voltage generation portion of the charge transfer sense amplifier, the reference voltage generation portion further includes, a reference bitline (Crb) coupled to a reference voltage (Vr), the reference bitline (Crb) being coupled to a pair of dummy capacitance cells, each of the dummy capacitance cells being preset before reading at an opposite relative polarity, and a pair of parallel capacitances coupled to the reference voltage (Vr), wherein the pair of dummy capacitance cells and the pair of parallel capacitances operate to generate a mid-voltage at the reference voltage (Vr).

17. A charge transfer sense amplifier as recited in claim 16, further comprising a dummy plate line (DPL) that couples to each of the pair of dummy capacitance cells.

18. A charge transfer sense amplifier as recited in claim 16, wherein an inverter is coupled between each of the pair of dummy capacitance cells along the reference bitline (Crb).

19. A charge transfer sense amplifier as recited in claim 16, wherein a cascade device including an NMOS transistor and a NOR gate is coupled along the reference bitline (Crb).

20. A charge transfer sense amplifier as recited in claim 16, wherein the mid-voltage is defined as Vs(0)<Vr<Vs(1), where Vs(0) defines storage of "0" and Vs(1) defines storage of "1."

21. A charge transfer sense amplifier as recited in claim 16, wherein a bitline (Cb) of the memory cell access portion includes a cascade device, the cascade device including an NMOS transistor and a NOR gate.

22. A charge transfer sense amplifier as recited in claim 16, wherein the memory cell access portion includes a write path, the write path coupling to a bitline Cb and a plate line PL.

23. A charge transfer sense amplifier as recited in claim 16, wherein the reference voltage generation portion includes a write path, the write path coupling to a reference bitline Crb and a dummy plate line DPL.

* * * * *